US011600497B2

(12) United States Patent
Madhogarhia et al.

(10) Patent No.: US 11,600,497 B2
(45) Date of Patent: Mar. 7, 2023

(54) USING ABSOLUTE Z-HEIGHT VALUES FOR SYNERGY BETWEEN TOOLS

(71) Applicant: KLA CORPORATION, Milpitas, CA (US)

(72) Inventors: Sandeep Madhogarhia, Howrah (IN); Hari Sriraman Pathangi, Chennai (IN); Rohit Bhat, Milpitas, CA (US)

(73) Assignee: KLA CORPORATION, Milpitas, CA (US)

( * ) Notice: Subject to any disclaimer, the term of this patent is extended or adjusted under 35 U.S.C. 154(b) by 284 days.

(21) Appl. No.: 16/836,828

(22) Filed: Mar. 31, 2020

(65) Prior Publication Data

US 2020/0321221 A1 Oct. 8, 2020

Related U.S. Application Data

(60) Provisional application No. 62/849,401, filed on May 17, 2019.

(51) Int. Cl.
| | |
|---|---|
| *H01L 21/461* | (2006.01) |
| *G01B 7/31* | (2006.01) |
| *H01L 21/02* | (2006.01) |
| *G01B 15/02* | (2006.01) |
| *G01N 23/22* | (2018.01) |

(52) U.S. Cl.
CPC ............. *H01L 21/461* (2013.01); *G01B 7/31* (2013.01); *G01B 15/025* (2013.01); *G01N 23/22* (2013.01); *H01L 21/02689* (2013.01)

(58) Field of Classification Search
CPC ............ H01L 21/461; H01L 21/02689; H01L 21/67288; H01L 21/67259; H01L 22/12; H01L 22/24; G01B 7/31; G01B 15/025; G01B 11/0608; G01B 15/00; G01B 2210/56; G01N 23/22
See application file for complete search history.

(56) References Cited

U.S. PATENT DOCUMENTS

| | | | |
|---|---|---|---|
| 7,919,760 B2 | 4/2011 | Jau et al. | |
| 2004/0246476 A1* | 12/2004 | Bevis | G01N 21/474 |
| | | | 356/237.5 |
| 2005/0023491 A1 | 2/2005 | Young et al. | |
| 2009/0206259 A1 | 8/2009 | Obara et al. | |
| 2009/0309022 A1 | 12/2009 | Gunji et al. | |
| 2013/0284924 A1 | 10/2013 | Mizuochi et al. | |
| 2014/0132948 A1 | 5/2014 | Shchegrov | |

(Continued)

FOREIGN PATENT DOCUMENTS

JP 4585876 B2 11/2010

OTHER PUBLICATIONS

WIPO, ISR for PCT/US2020/026805, Jul. 29, 2020.
EPO, European Search Report and Opinion for EP Application No. 20787938.8, dated Nov. 28, 2022.

*Primary Examiner* — Kiho Kim
(74) *Attorney, Agent, or Firm* — Hodgson Russ LLP (57) ABSTRACT

A semiconductor review tool receives absolute Z-height values for the semiconductor wafer, such as a semiconductor wafer with a beveled edge. The absolute Z-height values can be determined by a semiconductor inspection tool. The semiconductor review tool reviews the semiconductor wafer within a Z-height based on the absolute Z-height values. Focus can be adjusted to within the Z-height.

14 Claims, 6 Drawing Sheets

(56) References Cited

U.S. PATENT DOCUMENTS

2015/0321312 A1* 11/2015 Zhang .................. B24B 37/345
                                                                       451/28
2017/0047193 A1   2/2017  Jiang et al.
2018/0113084 A1   4/2018  Hench et al.
2018/0253007 A1   9/2018  Kodama et al.

* cited by examiner

FIG. 1
(Prior Art)

| Parameter | Sample Value | Remark |
|---|---|---|
| ThMin | -25.5 | SEMI Standard |
| ThMax | -19.5 | SEMI Standard |
| Zn | -500 | Assumption, can be any number |
| Rd | 149800 | Considering any defect at this radial distance |
| Rb | 149700 | Assumption or can be calculated during alignment |
| Zs | -464.0941646 | Z-height sweep low |
| Ze | -439.446013 | Z-height sweep high |
| Zd = ABS(Zs-Ze) | 24.64815157 | Z-height Sweep Range; Larger radial value Rb would make Zd higher, requiring larger range |
| Zsweep min range | 20 | Configuration setting, can be altered |
| Zsweep-range | 30 | Can be any value above Zd (24.6), but may provide space for stability |
| Final Zsweep range | 30 | After providing the room as pointed above |

```
Columns 35 { int32 DEFECTID, int32 X, int32 Y, int32 XREL, int32 YREL, int32 IABS,
}
Data 1862$
{
  1 7930216 144934191 157930216 294934191 0 0 75986 97605 2845978829.7
    78540 0 1 0 0 0 0 0 0 0 0 7851 0.0000 0 0 N 0 270.0 -775953 0.000000
    0 0 0 0 ;
  2 7489400 144913857 157489400 294913857 0 0 91176 15105 1363366737.5
    85035 0 1 0 0 0 0 0 0 0 0 2353 0.0000 0 0 N 0 270.0 -775954 0.000000
    0 0 0 0 ;
  3 7601203 144975811 157601203 294975811 0 0 45605 7599 346636156.6
    47130 0 1 0 0 0 0 0 0 0 0 981 0.0000 0 0 N 0 270.0 -775946 0.000000
    0 0 0 0 ;
```

USING ABSOLUTE Z-HEIGHT VALUES FOR SYNERGY BETWEEN TOOLS

CROSS-REFERENCE TO RELATED APPLICATIONS

This application claims priority to the Indian patent application filed Apr. 6, 2019 and assigned Indian Provisional App No. 201941013944 and to the provisional patent application filed May 17, 2019 and assigned U.S. App. No. 62/849,401, the disclosures of which are hereby incorporated by reference.

FIELD OF THE DISCLOSURE

This disclosure relates to inspection and review of semiconductor wafers.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

Many semiconductor wafers have a beveled edge. A beveled edge on a wafer means that the top surface is not completely flat. Beveled edges can affect accuracy and speed of measurements. Beveled edges also can complicate inspection and review.

Figure 1:
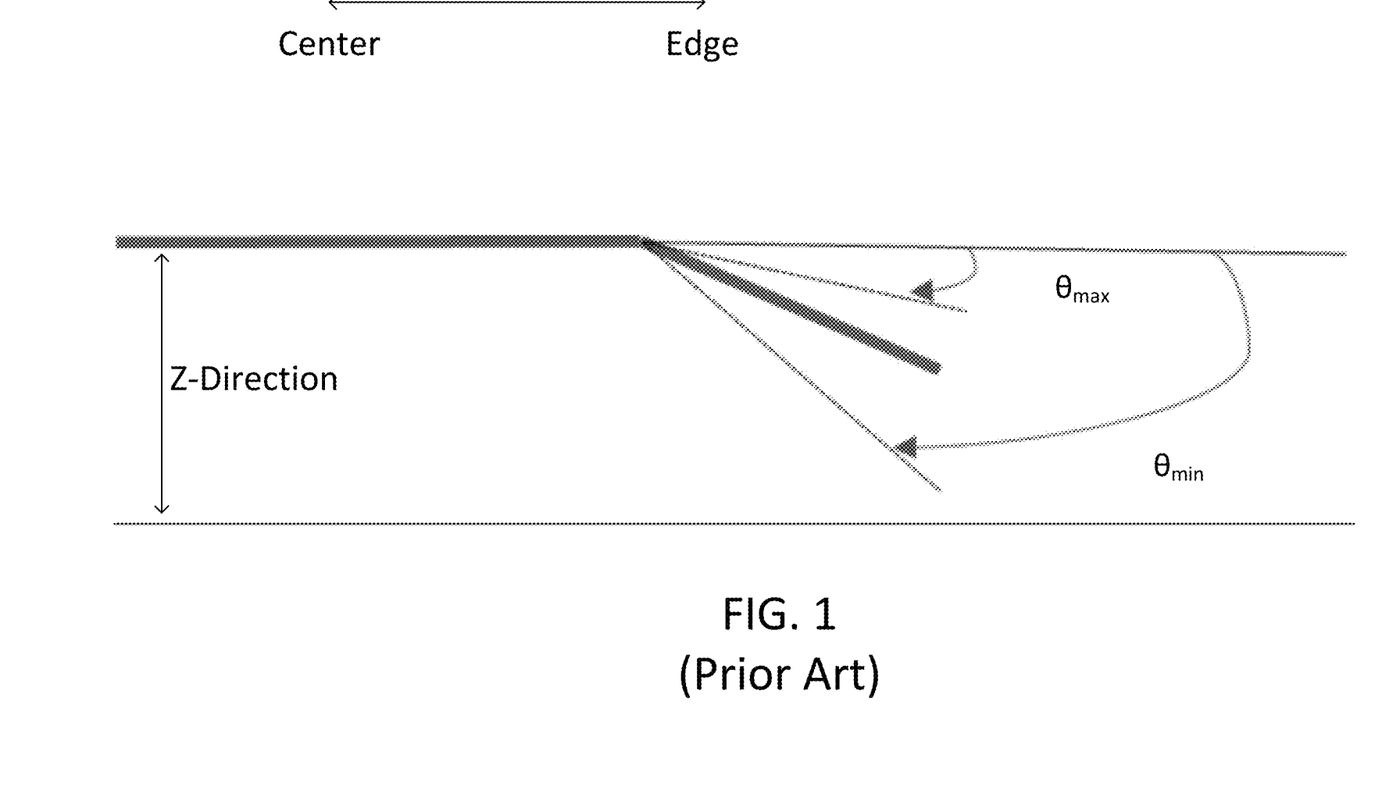
FIG. 1 illustrates an existing auto-focus method.

Auto-focus in the Z-direction of a wafer having a beveled edge can be performed. The Z-direction is the thickness of a wafer, which is affected by the bevel. Existing Z-height auto-focus uses as assumption of possible bevel angles under a SEMI standard. As shown in FIG. 1, the possible angle ranges from $\theta_{max}$ to $\theta_{min}$. The range of Z-direction values increases moving radially outward along the bevel from a center of the wafer.

In the example of FIG. 1, Zn is a nominal height in the Z-direction at which the height sensor locks on wafer front surface for a particular defect site. Zn is measured at the same angular position as the defect at radius (e.g., 145 mm). Rd is the radial position of the defect, which can come from a data file such as KLARF used by KLA Corporation. Rb is the radius of the bevel circle along an inner edge. Rd is greater than Rb for most bevel defects. $\theta_{min}$ and $\theta_{max}$ are the minimum and maximum bevel angles, respectively, per the SEMI standard. For example, $\theta_{min}$ may be 25.5 and $\theta_{max}$ may be 19.5.

Figure 2:
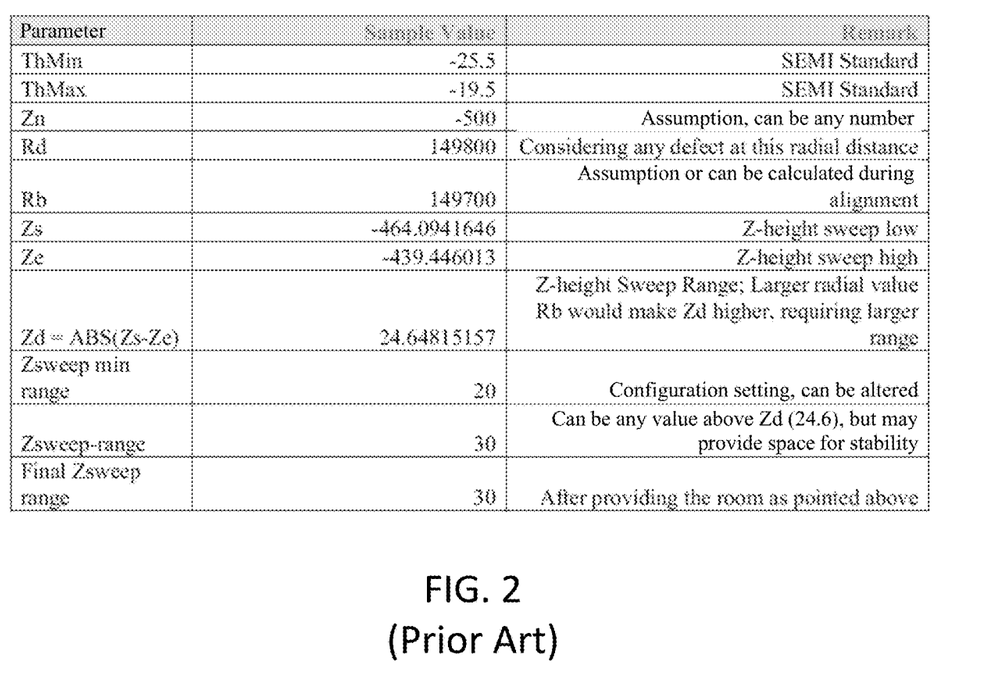
FIG. 2 is a table of variables.

A Z sweep auto-focus is not always implemented in the area before the bevel at the wafer edge (e.g., zone 1). As shown in the table of FIG. 2, a Z sweep of 30 μm is required to get the image in focus. As Rd increases, the Z sweep range will increase.

As shown in FIG. 2 for bevel use-cases, $\theta_{min}$ (ThMin) and $\theta_{max}$ (ThMax) are minimum and maximum bevel angle. The SEMI standard for these are −25.5 and −19.5 respectively. Zn is the nominal Z-height at which the height sensor locks on wafer front surface for a particular defect site. It is measured at the same angular position as the defect at a radius of 145 mm. For simplicity of this example, it is assumed to be at −500 Rd is the radial position of the defect (e.g., from a data file like KLARF). Rb is the radius of the bevel circle at an inner edge. Rd is greater than Rb for many "real" bevel defects. Considering a defect at radial distance Rd of 149800 μm and the radius of bevel inner circle Rb of 149700 μm (or as calculated during alignment), the Z-height sweep range would be between −464.09 μm and −439.45 Zs and Ze are the Z-height lower and higher sweep limit, respectively. The total sweep range, Zd, would be difference between Zs and Ze and would come out to be 24.65 μm for the example numbers above. Keeping some room for better focus stability, a Z-height sweep of 30 μm would be needed to get a defect a radial distance Rd of 149800 μm in focus.

Figure 3:
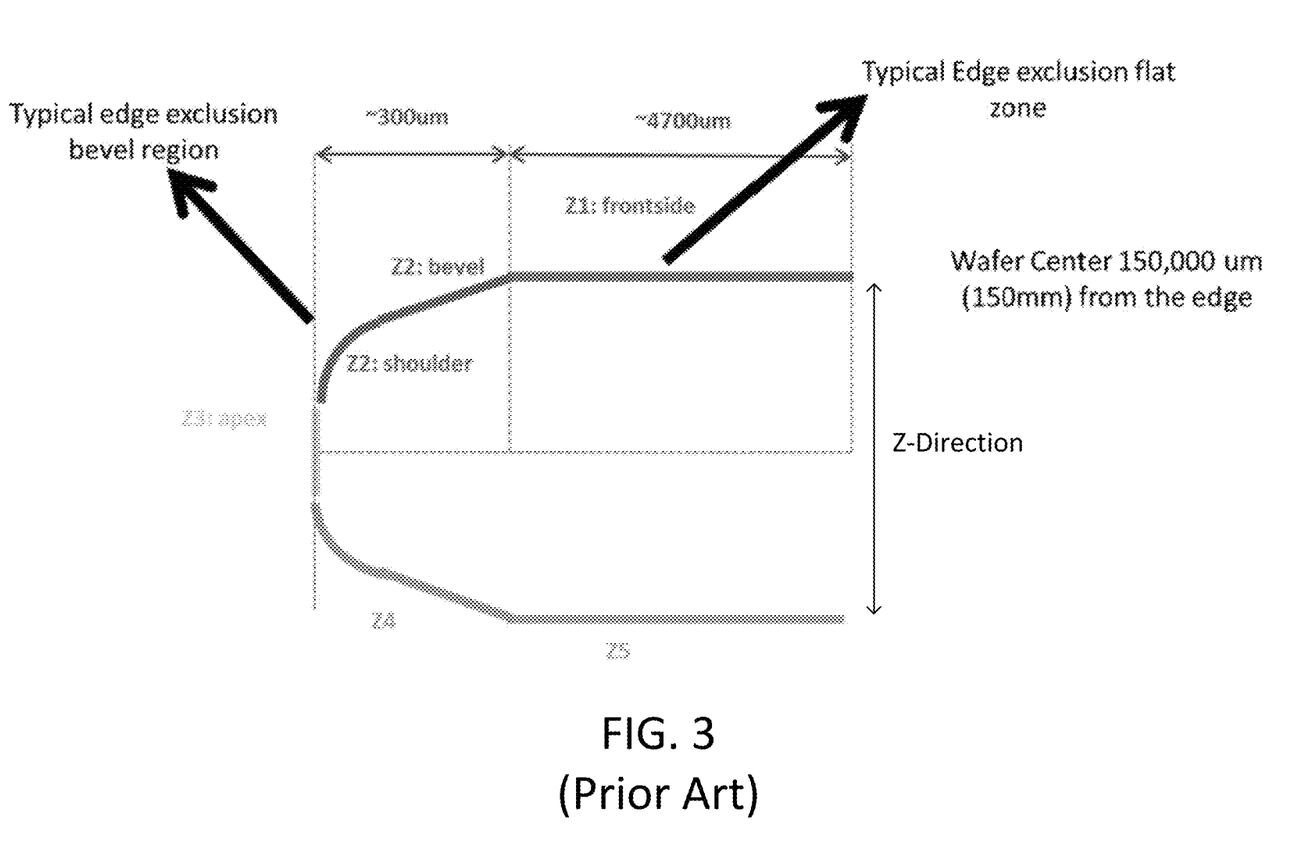
FIG. 3 illustrates the edge exclusion zone of a typical wafer.

FIG. 3 illustrates the edge exclusion zone of a typical wafer. Older semiconductor wafer review tools do not review 5000 μm from the edge. Newer semiconductor wafer review tools do not review 1500 μm from the edge and include a bevel review that reviews 40 μm to 50 μm from the edge. The region closest to the edge is not flat like the majority of the wafer surface, so there can be a height difference between points at different radial distances. Even for the same radial distance, the Z-height offset between points may be different depending on the polar angle.

Z-height auto-focus is needed in the bevel region for optimal focus of the image. This is a slow process. For example, only 30 sites per hour can be imaged based on assumption of the bevel roll-off angle θ. In an instance, θ is an actual angle on the wafer bevel angle between $\theta_{max}$ and $\theta_{min}$. This forces semiconductor manufacturers to perform a sweep for a wide-range of Z-heights to get the images of the bevel region to be in focus and/or sharp because the roll-off angle assumption is not accurate.

Besides having low throughput, existing methods are blind to the actual Z-height of the defect. Thus, obtaining sharp defect signals is difficult. The defect signal is important for review and inspection. Without knowing the actual Z-height of the defect, a large auto-focus range is needed. SEMI standard assumptions do not provide enough guidance for throughput needed for next generation semiconductor manufacturing throughput. The sweep range to get the defects in focus while moving radially outward increases. However, the SEMI standards are guidelines. Accuracy to the SEMI standards cannot be guaranteed and semiconductor manufacturers are not monitoring actual bevel surface parameters on processed wafers or on all inspection layers.

Therefore, improved inspection systems and methods are needed.

BRIEF SUMMARY OF THE DISCLOSURE

A system is provided in a first embodiment. The system comprises a particle beam generator that generates a particle beam; a platen configured to hold a semiconductor wafer; a detector configured to receive the particle beam reflected off the semiconductor wafer; and a processor in electronic communication with detector. The processor is configured to receive absolute Z-height values for the semiconductor wafer and to send instructions to review the semiconductor wafer with the particle beam within a Z-height based on the absolute Z-height values. In an instance, the semiconductor wafer has a beveled edge.

The processor can receive azimuthal angle values and polar angle values with the absolute Z-height values.

The particle beam can be a photon beam or an electron beam.

The processor can be further configured to adjust focus to within the Z-height.

The processor can be further configured to determine a correlation of the Z-height to a Z-height value of a semiconductor inspection tool separate from the system. The correlation can be determined at azimuthal angle values and polar angle values.

A method is provided in a second embodiment. The method comprises receiving, at a semiconductor review tool, absolute Z-height values for a semiconductor wafer. The semiconductor wafer is reviewed using the semiconductor review tool. The review begins at the absolute Z-height values and includes sweeping the Z-height on the semiconductor wafer. In an instance, the semiconductor wafer has a beveled edge.

The semiconductor review tool can receive azimuthal angle values and polar angle values with the absolute Z-height values.

The method can further include inspecting a semiconductor wafer with a semiconductor inspection tool and determining, using measurements from the semiconductor inspection tool, the absolute Z-height values.

The method can further include determining a correlation between a Z-height value from the second semiconductor inspection tool and the Z-height using the semiconductor inspection tool. The semiconductor review tool can receive azimuthal angle values and polar angle values with the absolute Z-height values. The correlation is performed at locations at the azimuthal angle values and polar angle values.

A non-transitory computer-readable storage medium is provided in a third embodiment. The non-transitory computer-readable storage medium comprises one or more programs for executing the following steps on one or more computing devices. Absolute Z-height values are received for a semiconductor wafer. Instructions are sent. The instructions are to review the semiconductor wafer with a particle beam within a Z-height based on the absolute Z-height values.

The steps can include adjusting focus to within the Z-height.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein use absolute Z-height (Z-ABS) from CIRCL manufactured by KLA Corporation or other semiconductor wafer inspection tools. Absolute Z-height can be used as an accurate starting point for z-height based auto-focus on a scanning electron microscope tool. Additionally, an azimuthal angle (φ) and polar angle (θ) of the wafer or of the point (e.g., defect) on the wafer can be used for improvements on a review tool, such as one-time/multiple calibration or alignment of an inspection tool's Z-height to a review tool's Z-height based on polar and/or azimuthal angle. While CIRCL and other bevel inspection tools are disclosed, embodiments disclosed herein can be used with any bare or unpatterned wafer inspection, review, or process tools.

Embodiments disclosed herein create a pipeline between semiconductor wafer inspection and review tools to use absolute Z-height values, azimuthal angle values, and polar angle values from the inspection tool in the review tool. Instead of relying on SEMI standards to estimate the range of Z-height at which the defect is expected to come in focus, the absolute Z-height values from an inspection tool (e.g., CIRCL) is used. When the inspection tool inspects and reports a defect location, it also reports the absolute Z-height values along with other defect position information like azimuthal angle values and polar angle values. The absolute Z-height values can be used as a starting point to sweep Z-height.

Instead of being blind to the actual Z-height of the defect, an absolute Z-height value is used from previous measurements. A focused signal from the defect can be more consistently obtained compared to previous techniques. The embodiments disclosed herein provide a throughput improvement, which lowers the cost of ownership for bevel review. Instead of a wide range of Z sweep to get defects in focus, Z-height of the defects based on absolute Z-height values can be determined. A correlation between absolute Z-height values and Z-heights for best focus in a review tool can be obtained.

Embodiments disclosed herein also avoid Z sweep extending radially outward, which increases the amount of time needed to get defects in focus. Such sweeps are limited for a large range of focus. For example, previous 30 µm sweeps can be achieved using absolute Z-height values and a few microns of sweep to fine-tune focus (if needed).

Figure 5:
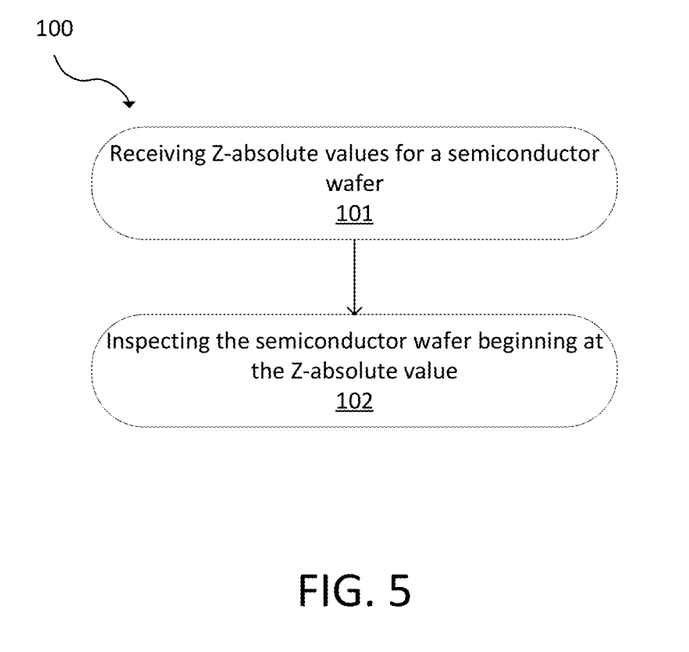
FIG. 5 is a block diagram of a method in accordance with the present disclosure.

FIG. 5 is a block diagram of a method 100. At 101, a semiconductor review tool receives absolute Z-height values for a semiconductor wafer. Absolute Z-height is the height of the defect present on the wafer as reported in the bevel inspector of other inspection tools. Absolute Z-height can be with respect to a reference. The reference may be anything that does not vary in context of the experiment or measurement. For example, the reference can be the floor height on which the tool is standing. Here, the reference height is from an immobile inspector tool component. For simplicity, the reference is top flat portion of the wafer.

Data from KLARF or other data files may not need to be processed. The height received in KLARF is in standard units (e.g., µm or nm). Other data files may need further processing.

It is the height that the height of the defect that the bevel inspector has measured. The semiconductor wafer may have a beveled edge. At 102, the semiconductor wafer is reviewed using the semiconductor review tool beginning at the absolute Z-height value or values. A range of absolute Z-height values may be used in an instance. The semiconductor inspection tool can sweep Z-height on the semiconductor wafer, such as beginning at the absolute Z-height values. Sweeping the Z-height can range from, for example, the values shown in FIG. 2. Thus, the Z-height of the defect can be determined using the absolute Z-height values.

The semiconductor review tool also can receive azimuthal angle values and polar angle values with the absolute Z-height values. The azimuthal angle values and polar angle values can be used to inspect the wafer with the semiconductor review tool.

The method 100 can further include inspecting a semiconductor wafer with a semiconductor inspection tool, such as CIRCL. Using measurements from the semiconductor inspection tool, the absolute Z-height values can be determined. Z-height values can be measured when inspecting defects.

Absolute Z-height values, azimuthal angle values, and polar angle values can be used to form an empirical correlation map between absolute Z-height values and Z-height values for best focus for various absolute Z-height values, azimuthal angle values, and polar angle values. To be correlated, the difference between two numbers may be the same. A few defect locations are needed for this empirical correlation. For example, three to five defect locations can be used. This can eliminate or limit the need of sweeping for a wide Z-sweep range to get the images in focus. Z-height reported on the inspection tool versus Z-height for best focus can be determined at various azimuthal angle values and polar angle values. For example, Z-height for best focus can be determined using the conventional method of Z-height sweep based on SEMI standards. The correlation can be established between the two for some defect position at different azimuthal and polar angles. This calibration can eliminate the need to sweep Z-height on a review tool after the correlation is established.

In an instance, a correlation between a Z-height value from the semiconductor inspection tool and the Z-height using the semiconductor review tool can be determined. The semiconductor review tool can receive azimuthal angle values and polar angle values with the absolute Z-height values. The correlation can be performed at locations at the azimuthal angle values and polar angle values.

For example, the previous method can suggest a 30 µm sweep range because the Z-height of a defect may be anywhere in this range based on roll-off angle at the wafer. Instead of estimation, embodiments disclosed herein uses absolute Z-height values from the inspection tool and sweeps for a few microns in Z-height.

Figure 4:
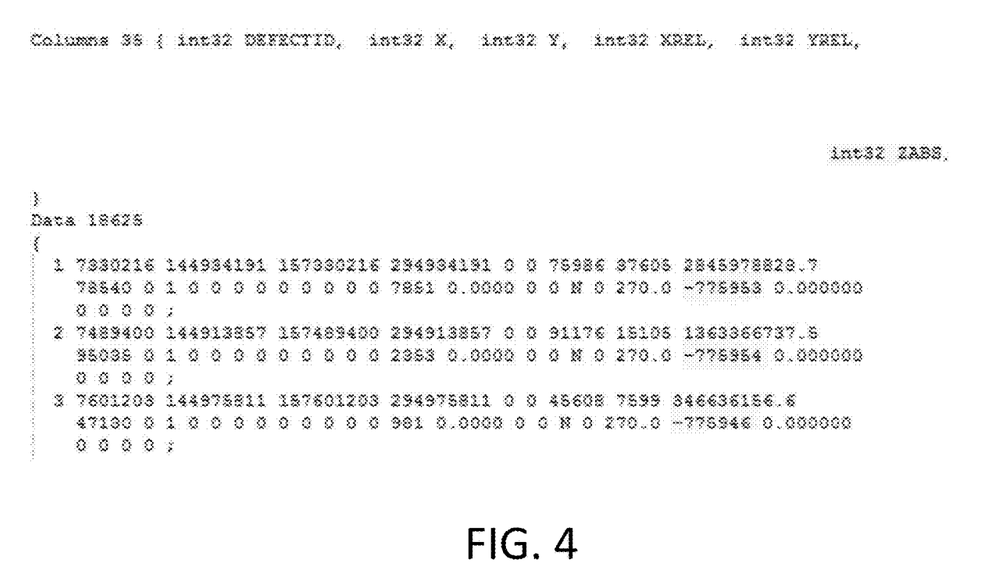
FIG. 4 is a table showing absolute Z-height for certain defects from a sample CIRCL KLARF.

In an example, absolute Z-height values are highlighted for certain defects using data from a CIRCL tool. The CIRCL tool can measure the surface of the semiconductor wafer from Z1 to Z5, as illustrated in FIG. 3, and can provide a map of dimensions, angles, and/or morphology.

Previous techniques used X and Y locations of the defect to find Rd. A wide range of Z sweep was estimated based on roll-off angle from SEMI standards. This Z sweep was used to determine where the defect may be in focus. Instead, absolute Z-height values and correlation between absolute Z-height values and Z-heights for best focus in a review tool is used to obtain best focus Z-height for the defect.

The relation between absolute Z-height values and Z-heights for best focus of the defect on review tool can be determined. This can be done by selecting few defects and plotting absolute Z-height values against Z-heights on the review tool for best focus and determining a correlation between them.

If there are n defects, the correlation disclosed herein and the absolute Z-height values from the inspection tool can be used to get the best focus Z-height on review tool. A few microns sweep across this range can be used to get the images in focus in review.

The sweep range can be potentially reduced by 7x. For example, 30 µm for full sweep can be reduced to 4 µm for focus fine tuning, which increases bevel review throughput and reduces bevel review cost of ownership. Besides increasing throughput, embodiments disclosed herein can reduce false positives because a narrow sweep range is used.

In an instance, a system (e.g., a review tool) includes a particle beam generator that generates a particle beam. The particle beam can be a beam of electrons or a beam of photons. The system further includes a platen configured to hold a semiconductor wafer; a detector configured to receive the particle beam reflected off the semiconductor wafer; and a processor in electronic communication with detector. The processor is configured to receive absolute Z-height values for the semiconductor wafer and send instructions to review the semiconductor wafer with the particle beam within a Z-height based on the absolute Z-height values. The semiconductor wafer can have a beveled edge. The review can include imaging the semiconductor wafer and classifying, categorizing, or otherwise analyzing defects.

The processor can receive azimuthal angle values and polar angle values with the absolute Z-height values.

The processor can be further configured to adjust focus to within the Z-height.

The processor also can be further configured to determine a correlation of the Z-height to a Z-height value of a semiconductor inspection tool separate from the system. The correlation can be determined at azimuthal angle values and polar angle values.

Figure 6:
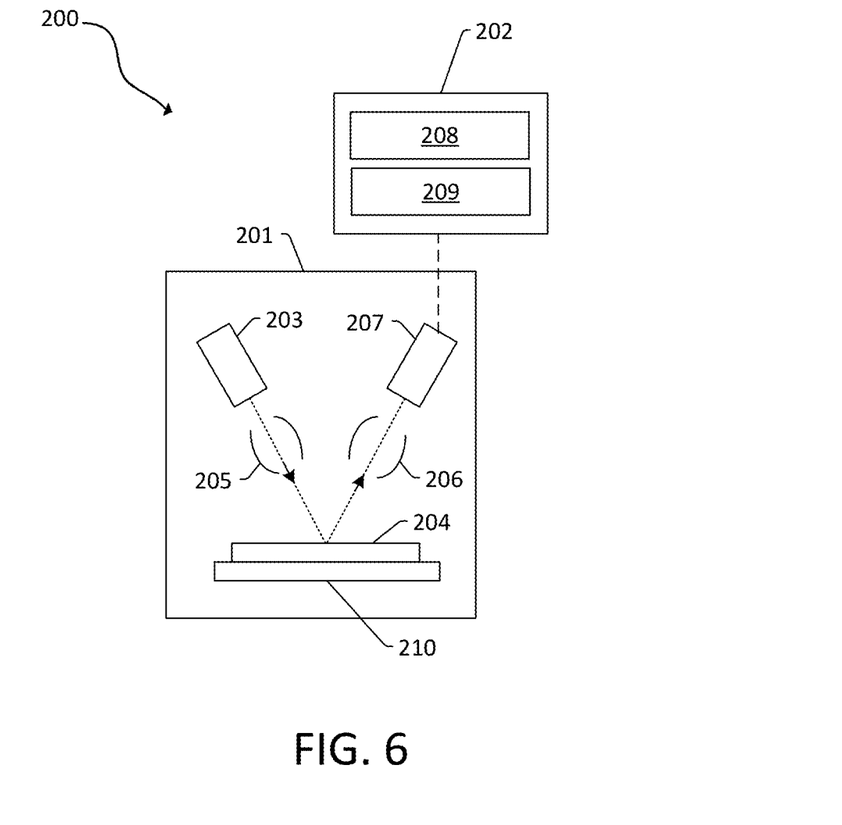
FIG. 6 is a system in accordance with the present disclosure.

FIG. 6 is a block diagram of an embodiment of a system 200 that can implement the embodiments disclosed herein. The system 200 includes a wafer inspection tool (which includes the electron column 201) configured to generate images of a wafer 204.

The wafer inspection tool includes an output acquisition subsystem that includes at least an energy source and a detector. The output acquisition subsystem may be an electron beam-based output acquisition subsystem. For example, in one embodiment, the energy directed to the wafer 204 includes electrons, and the energy detected from the wafer 204 includes electrons. In this manner, the energy source may be an electron beam source. In one such embodiment shown in FIG. 6, the output acquisition subsystem includes electron column 201, which is coupled to computer subsystem 202. A stage 210 may hold the wafer 204.

As also shown in FIG. 6, the electron column 201 includes an electron beam source 203 configured to generate electrons that are focused to wafer 204 by one or more elements 205. The electron beam source 203 may include, for example, a cathode source or emitter tip. The one or more elements 205 may include, for example, a gun lens, an anode, a beam limiting aperture, a gate valve, a beam current selection aperture, an objective lens, and a scanning subsystem, all of which may include any such suitable elements known in the art.

Electrons returned from the wafer 204 (e.g., secondary electrons) may be focused by one or more elements 206 to detector 207. One or more elements 206 may include, for example, a scanning subsystem, which may be the same scanning subsystem included in element(s) 205.

The electron column 201 also may include any other suitable elements known in the art.

Although the electron column 201 is shown in FIG. 6 as being configured such that the electrons are directed to the wafer 204 at an oblique angle of incidence and are scattered from the wafer 204 at another oblique angle, the electron beam may be directed to and scattered from the wafer 204 at any suitable angles. In addition, the electron beam-based output acquisition subsystem may be configured to use multiple modes to generate images of the wafer 204 (e.g., with different illumination angles, collection angles, etc.). The multiple modes of the electron beam-based output acquisition subsystem may be different in any image generation parameters of the output acquisition subsystem.

Computer subsystem 202 may be coupled to detector 207 as described above. The detector 207 may detect electrons returned from the surface of the wafer 204 thereby forming electron beam images of the wafer 204. The electron beam images may include any suitable electron beam images. Computer subsystem 202 may be configured to perform any of the functions described herein using the output of the detector 207 and/or the electron beam images. Computer subsystem 202 may be configured to perform any additional step(s) described herein. A system 200 that includes the output acquisition subsystem shown in FIG. 6 may be further configured as described herein.

It is noted that FIG. 6 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 6 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 202 includes a processor 208 and an electronic data storage unit 209. The processor 208 may include a microprocessor, a microcontroller, or other devices.

The computer subsystem 202 may be coupled to the components of the system 200 in any suitable manner (e.g., via one or more transmission media, which may include wired and/or wireless transmission media) such that the processor 208 can receive output. The processor 208 may be configured to perform a number of functions using the output. The wafer inspection tool can receive instructions or other information from the processor 208. The processor 208 and/or the electronic data storage unit 209 optionally may be in electronic communication with another wafer inspection tool, a wafer metrology tool, or a wafer review tool (not illustrated) to receive additional information or send instructions.

The processor 208 is in electronic communication with the wafer inspection tool, such as the detector 207. The processor 208 may be configured to process images generated using measurements from the detector 207. For example, the processor may perform embodiments of the method 100 or method 200.

The computer subsystem 202, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 208 and electronic data storage unit 209 may be disposed in or otherwise part of the system 200 or another device. In an example, the processor 208 and electronic data storage unit 209 may be part of a standalone control unit or in a centralized quality control unit. Multiple processors 208 or electronic data storage units 209 may be used.

The processor 208 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 208 to implement various methods and functions may be stored in readable storage media, such as a memory in the electronic data storage unit 209 or other memory.

If the system 200 includes more than one computer subsystem 202, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 208 may be configured to perform a number of functions using the output of the system 200 or other output. For instance, the processor 208 may be configured to send the output to an electronic data storage unit 209 or another storage medium. The processor 208 may be further configured as described herein.

The processor 208 or computer subsystem 202 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 208 may be configured according to any of the embodiments described herein. The processor 208 also may be configured to perform other functions or additional steps using the output of the system 200 or using images or data from other sources.

The processor 208 may be communicatively coupled to any of the various components or sub-systems of system 200 in any manner known in the art. Moreover, the processor 208 may be configured to receive and/or acquire data or information from other systems (e.g., inspection results or absolute Z-height values from an inspection system, a remote database including design data and the like) by a transmission medium that may include wired and/or wireless portions. In this manner, the transmission medium may serve as a data link between the processor 208 and other subsystems of the system 200 or systems external to system 200.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 208 (or computer subsystem 202) or, alternatively, multiple processors 208 (or multiple computer subsystems 202). Moreover, different sub-systems of the system 200 may include one or more computing or logic systems. Therefore, the above description should not be interpreted as a limitation on the present disclosure but merely an illustration.

An additional embodiment relates to a non-transitory computer-readable medium storing program instructions executable on a processor. In particular, a processor, such as the processor 208, can be coupled to a memory in an electronic data storage medium with non-transitory computer-readable medium, such as the electronic data storage medium 209, that includes executable program instructions. The computer-implemented method may include any step(s) of any method(s) described herein. For example, processor 208 may be programmed to perform some or all of the steps of method 100. The memory in the electronic data storage medium 209 may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In an embodiment, one or more programs are included on a non-transitory computer-readable storage medium, such as the electronic data storage medium 209. The one or more programs are for executing steps on one or more computing devices. For example, the steps can include receiving absolute Z-height values for a semiconductor wafer and sending instructions to review the semiconductor wafer with a particle beam within a Z-height based on the absolute Z-height values. Focus can be adjusted to within the Z-height.

While a tool that uses an electron beam is specifically illustrated, the embodiments disclosed herein can be used with a system that uses a photon beam, a detector, and a platen configured to hold a wafer.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
    a particle beam generator in a semiconductor review tool that generates a particle beam;
    a platen in the semiconductor review tool configured to hold a semiconductor wafer;
    a detector in the semiconductor review tool configured to receive the particle beam reflected off the semiconductor wafer; and
    a processor in electronic communication with detector, wherein the processor is configured to:
        receive absolute Z-height values with respect to a tool component of the semiconductor review tool, azimuthal angle values, and polar angle values for the semiconductor wafer;
        send instructions to review the semiconductor wafer with the particle beam within a Z-height based on the absolute Z-height values at locations of the azimuthal angle values and the polar angle values; and adjust focus of the semiconductor review tool to within the Z-height during the review of the semiconductor wafer.

2. The system of claim 1, wherein the semiconductor wafer has a beveled edge.

3. The system of claim 1, wherein the particle beam is a photon beam.

4. The system of claim 1, wherein the particle beam is an electron beam.

5. The system of claim 1, wherein the processor is further configured to determine a correlation of the Z-height to a Z-height value of a semiconductor inspection tool separate from the system.

6. The system of claim 5, wherein the correlation is determined at the azimuthal angle values and the polar angle values.

7. A method comprising:
receiving, at a semiconductor review tool, absolute Z-height values with respect to a tool component of a semiconductor review tool, azimuthal angle values, and polar angle values for a semiconductor wafer;
reviewing the semiconductor wafer using the semiconductor review tool at locations of the azimuthal angle values and the polar angle values, wherein the review begins at the absolute Z-height values includes sweeping a Z-height on the semiconductor wafer; and
adjusting focus of the semiconductor review tool to within the Z-height during the review of the semiconductor wafer.

8. The method of claim 7, wherein the semiconductor wafer has a beveled edge.

9. The method of claim 7, further comprising:
inspecting a semiconductor wafer with a semiconductor inspection tool; and
determining, using measurements from the semiconductor inspection tool, the absolute Z-height values.

10. The method of claim 9, further comprising determining a correlation between a Z-height value from the second semiconductor inspection tool and the Z-height using the semiconductor inspection tool.

11. The method of claim 10, wherein the correlation is performed at locations at the azimuthal angle values and the polar angle values.

12. A non-transitory computer-readable storage medium, comprising one or more programs for executing the following steps on one or more computing devices:
receiving absolute Z-height values with respect to a tool component of a semiconductor review tool, azimuthal angle values, and polar angle values for a semiconductor wafer; and
sending instructions to review the semiconductor wafer with a particle beam within a Z-height based on the absolute Z-height values at locations of the azimuthal angle values and the polar angle values; and
adjusting focus of the semiconductor review tool to within the Z-height during the review of the semiconductor wafer.

13. The non-transitory computer-readable storage medium of claim 12, wherein the steps include determining a correlation between a Z-height value from the second semiconductor inspection tool and the Z-height using the semiconductor inspection tool.

14. The non-transitory computer-readable storage medium of claim 13, wherein the correlation is performed at locations at the azimuthal angle values and the polar angle values.

* * * * *